(12) United States Patent
Nakabayashi et al.

(10) Patent No.: US 8,669,162 B2
(45) Date of Patent: Mar. 11, 2014

(54) SEMICONDUCTOR DEVICE AND METHOD OF MANUFACTURING THE SAME

(75) Inventors: Yukio Nakabayashi, Yokohama (JP); Toshinori Numata, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 13/401,478

(22) Filed: Feb. 21, 2012

(65) Prior Publication Data

US 2012/0146114 A1 Jun. 14, 2012

Related U.S. Application Data

(63) Continuation of application No. PCT/JP2009/065667, filed on Sep. 8, 2009.

(51) Int. Cl.
*H01L 21/336* (2006.01)

(52) U.S. Cl.
USPC .... 438/299; 438/197; 257/288; 257/E29.255; 257/E21.409

(58) Field of Classification Search
USPC ................ 438/299, 197; 257/288, E29.255, 257/E21.409
See application file for complete search history.

(56) References Cited

U.S. PATENT DOCUMENTS 7,531,853 B2  5/2009  Saito et al.
8,039,843 B2  10/2011  Inaba

FOREIGN PATENT DOCUMENTS

JP  2007-294757  11/2007
JP  2007-329295  12/2007
JP  2009-054705  3/2009

OTHER PUBLICATIONS

International Search Report issued Oct. 13, 2009 in PCT/JP2009-065667 filed Sep. 8, 2009.
International Preliminary Report on Patentability and Written Opinion issued Apr. 11, 2012 in PCT/JP2009/065667 filed on Sep. 8, 2009.

*Primary Examiner* — Timor Karimy
(74) *Attorney, Agent, or Firm* — Oblon, Spivak, McClelland, Maier & Neustadt, L.L.P.

(57) ABSTRACT

A method of manufacturing a semiconductor device according to an embodiment includes: forming a plurality of semiconductor layers located at a distance from one another on a first insulating film; forming a gate insulating film that covers both side faces and an upper face of each of the semiconductor layers; forming a gate electrode of a polysilicon film to cover the gate insulating film of each of the semiconductor layers; forming a second insulating film on an entire surface; exposing an upper face of the gate electrode by performing selective etching on a portion of the second insulating film; siliciding the gate electrode; and forming a stress applying film that applies a stress in a direction perpendicular to the extending direction of each of the semiconductor layers and parallel to an upper face of the first insulating film.

7 Claims, 7 Drawing Sheets

SEMICONDUCTOR DEVICE AND METHOD OF MANUFACTURING THE SAME

CROSS REFERENCE TO RELATED APPLICATIONS

This application is a continuation application based upon and claims the benefit of priority from prior PCT/JP2009/065667 filed on Sep. 8, 2009 in Japan, the entire contents of which are incorporated herein by reference.

FIELD

Embodiments described herein relate generally to a semiconductor device and a method of manufacturing the semiconductor device.

BACKGROUND

High-integration and high-performance LSIs have been realized by miniaturizing field effect transistors (hereinafter also referred to as FETs) that are the fundamental structural components of the LSIs, and achieving higher performance through the miniaturization. The performance of a FET is determined by how large the magnitude of the drive current is during ON-state operation and how small the magnitude of the channel leakage current is during OFF-state operation.

To reduce leakage currents, FD (Fully-Depleted) devices that have their channel regions completely depleted and have high resistances to short channel effects are expected as the next-generation fundamental structural components. Among those devices, multi-gate transistors are particularly attracting attention. Unlike a structure of a conventional single-gate type, a structure of a multi-gate type has a minute channel region surrounded by gate electrodes. Such a structure has the advantages that the potential controllability in the channel region is made higher, decreases of the potential barrier due to short-channeling of the device can be restrained, and the leakage current in the OFF state can be reduced.

What matters in the performance of an integrated circuit are the threshold value control in each device and an increase in drive current. In a fully-depleted device, the voltage at which inversion charges are generated is characteristically lower than that in a bulk-type device. Therefore, in a conventional polysilicon gate electrode having a work function as the bandgap end, the current in the OFF state (0 volt) becomes too large. As of today, examples of novel gate electrodes include a structure in which a metal is used as the gate electrode (a metal gate), and a structure in which a compound of a metal and a semiconductor (a silicide if the semiconductor is silicon) is used as the gate electrode (a silicide gate).

Since the drive current is the product of the carrier (charge carrier) density and the carrier mobility, increasing the motility is effective to increase the drive current. To increase the carrier mobility, there is a suggested method by which a compound of a metal and a semiconductor is used as the gate electrode, and strain is caused in the channel region through a volume change in the compound. This method is designed for Fin-FETs (so-called three-dimensional double-gate transistors). According to this method, to perform precise lithography on polysilicon covering a tall Fin-type channel region with a height of 50 to 100 nm, for example, a polysilicon film flattened by CMP is silicided. Therefore, in this method, the portion of the silicided gate electrode that is not located above the channel region has the same height as the portion of the silicided gate electrode located above the channel region.

Introduction of strain to the channel region of a tri-gate transistor or a nanowire transistor has also been tried without success.

DETAILED DESCRIPTION

A method of manufacturing a semiconductor device according to an embodiment includes: forming a plurality of semiconductor layers that are located at a distance from one another on a first insulating film by performing patterning on a silicon film placed on the first insulating film, each of the semiconductor layers including a first region, a second region that is formed at a distance from the first region in an extending direction of each of the semiconductor layers, and a third region provided between the first region and the second region; forming a gate insulating film that covers both side faces and an upper face of the third region of each of the semiconductor layers; forming a gate electrode that is a polysilicon film to cover the gate insulating film of each of the semiconductor layers; forming a source region and a drain region in the first and second regions of each of the semiconductor layers; forming a second insulating film on an entire surface; exposing an upper face of the gate electrode by performing selective etching on a portion of the second insulating film, the portion being located above the gate electrode; siliciding the gate electrode; and forming a stress applying film that applies a stress to the third region of each of the semiconductor layers, the stress applying film being formed to cover the silicided gate electrode, the stress being applied in a direction that is perpendicular to the extending direction of each of the semiconductor layers and is parallel to an upper face of the first insulating film.

First, before describing an embodiment, the course of events for achieving the present invention will be described below.

For planar MOSFETs, there is a known method by which strain is caused in the channel regions to improve carrier mobility. Specifically, a continuous SiN film (a stress applying film) serving as a CESL (Contact Etch Stop Layer) is formed in the gate length direction so as to cover the gate electrode. As a result, concavities and convexities (steps) are formed, and a tensile stress or a compressive stress is applied to the SiN film by using the concavities and convexities. In this manner, strain is caused in the gate length direction of the channel region.

In a three-dimensional tri-gate transistor or a nanowire transistor, however, a stress applying film that is formed to cover the gate electrode after the formation of the gate electrode forms concavities and convexities in the extending direction of the gate electrode (or in the gate width direction) and in a direction perpendicular to the extending direction of the gate electrode (or in the gate length direction). Therefore, a compressive stress is applied in the gate length direction and the gate width direction to the channel region from the stress applying film. When a compressive stress is applied in a certain direction, a tensile stress is normally generated in a direction perpendicular to the certain direction. Therefore, in the above-mentioned three-dimensional transistor, the compressive stress applied in the gate length direction by the stress applying film is made smaller by the tensile stress generated in the gate length direction due to the compressive stress applied in the gate width direction. Likewise, the compressive stress applied in the gate width direction by the stress applying film is made smaller by the tensile stress generated in the gate width direction due to the compressive stress applied in the gate length direction. Therefore, after the formation of the gate electrode in a three-dimensional transistor, appropriate strain cannot be applied to the channel region even if a stress applying film that covers the gate electrode is formed.

Furthermore, if the pitch of devices becomes smaller as further miniaturization is achieved, the concavities and convexities in the stress applying film become smaller. As a result, the strain applied to the channel region by the stress applying film becomes smaller, and an increase in carrier mobility cannot be expected.

In view of the above, the inventors have made intensive studies to invent a structure that can improve the carrier mobility and increase the drive current in a three-dimensional tri-gate transistor or a nanowire transistor, in spite of miniaturization. Such a structure is described in the following embodiment.

Referring to FIGS. 1 through 7($d$), a method of manufacturing a semiconductor device according to the embodiment is described. The semiconductor device to be manufactured by the manufacturing method according to this embodiment is a three-dimensional multi-gate transistor. The semiconductor device described below is an n-channel transistor, but a p-channel transistor can be manufactured in the same manner by changing the ion species to be implanted.

Figure 1:
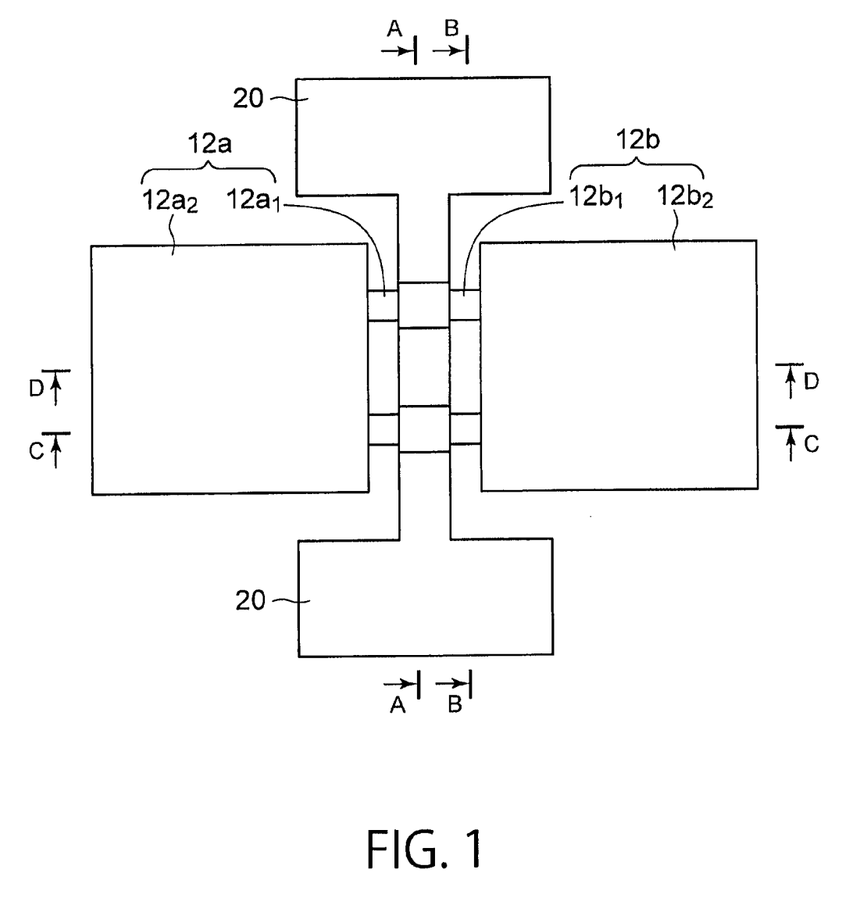
FIG. 1 is a top view of a three-dimensional multi-gate transistor according to an embodiment.

FIG. 1 is a top view of the three-dimensional multi-gate transistor manufactured by the manufacturing method according to this embodiment. This three-dimensional multi-gate transistor is manufactured in the following manner.

Figure 2:
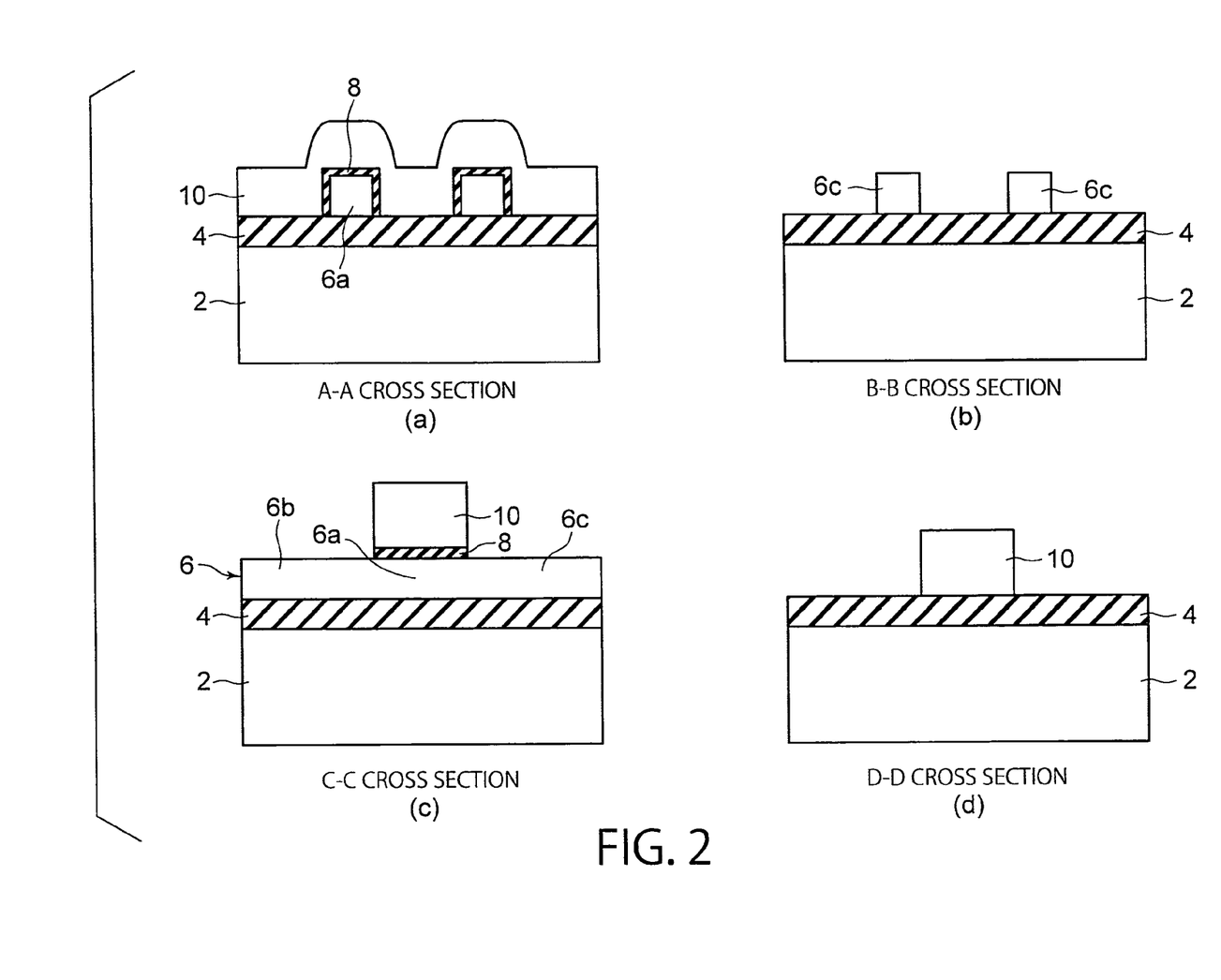
FIGS. 2(a) through 2(d) are cross-sectional views illustrating a method of manufacturing the three-dimensional multi-gate transistor according to the embodiment.

A SOI (Silicon On Insulator) substrate is used to produce the three-dimensional multi-gate transistor. The SOI substrate includes a supporting substrate 2, an insulating film 4 formed on the supporting substrate 2, and a SOI layer formed on the insulating film 4. The SOI layer has a thickness smaller than 50 nm (for example, 20 nm). As shown in FIGS. 2($a$) through 2($d$), a first silicon nitride film (not shown) that is to serve as the protection film for the channels is deposited on the insulating film 4 by using LPCVD (Low Pressure Chemical Vapor Deposition), for example. The first silicon nitride film has a thickness of approximately 100 nm. Device separation is then performed by a known device separation technique. In this embodiment, the plane orientation of the SOI layer is (001). Further, patterning is performed on the SOI layer by a conventional patterning technique, to form a semiconductor layer 6 that includes channel regions 6$a$, a first region 6$b$ to be a source region, and a second region 6$c$ to be a drain region. After that, the first silicon nitride film is removed. The first region 6$b$ and the second region 6$c$ have substantially the same height and width as those of the channel regions 6$a$, and each includes a first portion connected to the channel region 6$a$, and a second portion that is connected to the first portion. The second portion is as tall as the first portion but is wider than the first portion. When the transistor is completed, the first portions are turned into portions denoted by reference numerals 12$a_1$ and 12$b_1$ in FIG. 1, and the second portions are turned into portions denoted by reference numerals 12$a_2$ and 12$b_2$. Therefore, the first portions of the first region 6$b$ and the second region 6$c$, and the channel region 6$a$ constitute narrow portion. In FIGS. 1 and 2, two narrow portions are shown. FIGS. 2($a$) through 2($d$) are cross-sectional views of the semiconductor device, taken along the section lines A-A, B-B, C-C, and D-D, respectively, of FIG. 1. In this embodiment, the cross-sectional shape of each of the narrow portions is a rectangular shape, but may be a circular shape or an elliptical shape.

The width of each of the above described narrow portions (the thickness in a direction perpendicular to the direction extending from the source region to the drain region), which are formed by the channel regions 6$a$ and the first portions of the first region 6$b$ and the second region 6$c$, is 10 to 20 nm, for example. A 1-nm thick silicon dioxide film is then formed as a gate insulating film 8 by using RTO (Rapid Thermal Oxidation), for example. After that, plasma nitridation is performed to increase the dielectric constant of the gate insulating film 8. Instead of the formation of the silicon dioxide film and the plasma nitridation, a film made of a high dielectric constant (high-k) material may be formed as the gate insulating film.

Further, a polysilicon film that is to be a gate electrode 10 and has a thickness of 15 to 50 nm (a thickness of 50 nm, for example) is deposited by using LPCVD, for example. A second silicon nitride film (not shown) is then deposited on the polysilicon film. Patterning is then performed on the second silicon nitride film by using a photolithography technique or the like, to form a hard mask layer. After that, with the patterned hard mask layer being a mask, patterning is performed on the polysilicon film by RIE or the like, to form the gate electrode 10. In this embodiment, the height of the semiconductor layer to be the channel regions 6$a$ is as small as 20 nm. Therefore, precise lithography can be performed at the time of patterning to form the polysilicon film into a gate electrode shape, and flattening such as CMP does not need to be performed. As a result, concavities and convexities (steps) to be used for causing strain in the channel regions 6$a$ exist in the gate electrode 10 made of polysilicon covering the channel regions 6$a$, as shown in FIG. 2($a$). There are cases where an offset spacer or the like is formed after the patterning, but such an offset spacer is not shown in the drawings. The offset spacer is to be used when impurities are implanted into the source region and the drain region, so that the impurities in the source region and the drain region are prevented from diffusing deeply into the channel region at the time of annealing for activating the impurities.

Figure 3:
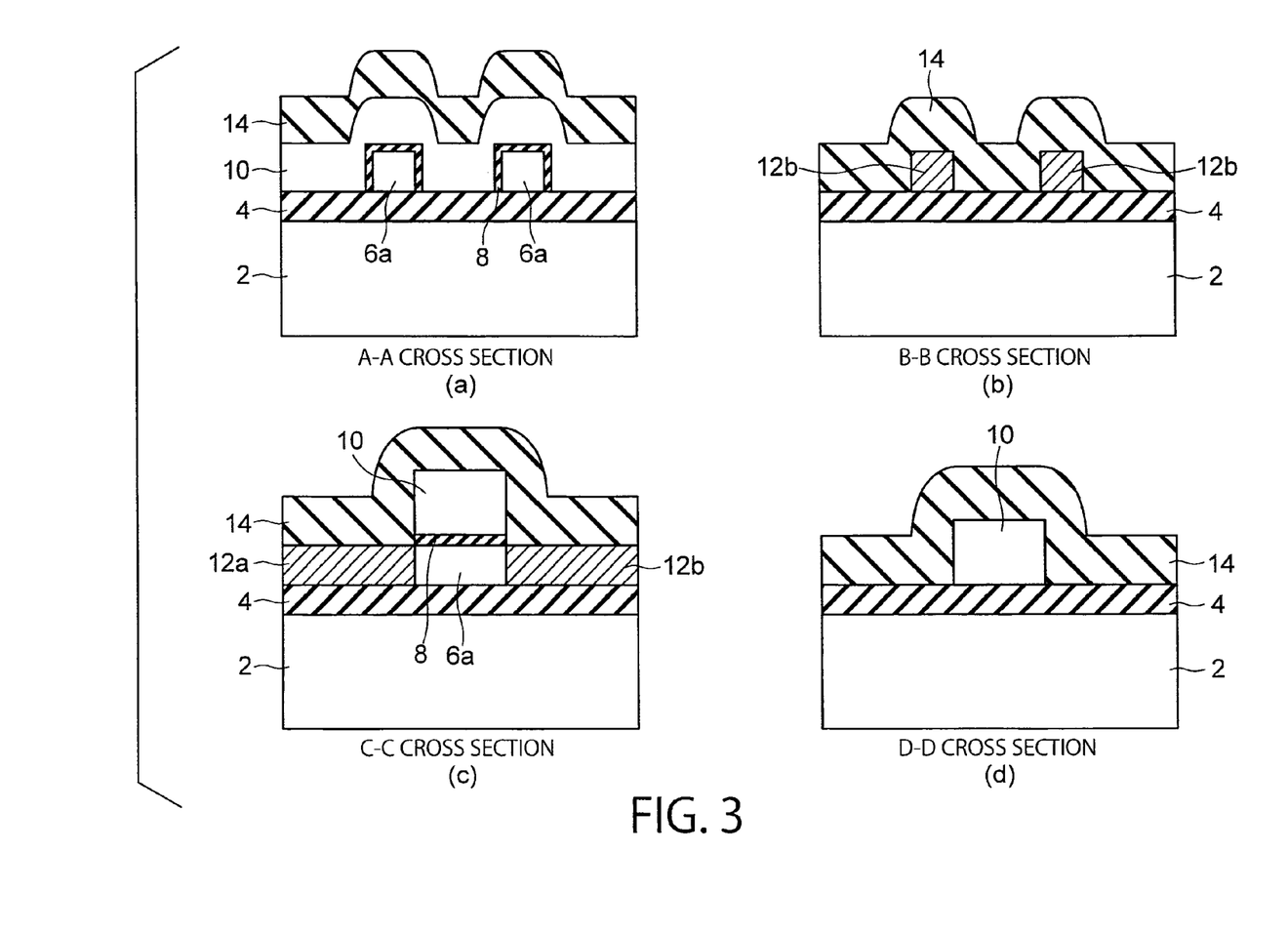
FIGS. 3(a) through 3(d) are cross-sectional views illustrating a method of manufacturing the three-dimensional multi-gate transistor according to the embodiment.

As shown in FIGS. 3($a$) through 3($d$), a metal film (such as a Ni film or a NiPt film) for siliciding the exposed first region 6$b$ and the exposed second region 6$c$ is deposited, and a heat treatment is performed to silicide the first region 6$b$ and the second region 6$c$, and form a source region 12$a$ and a drain region 12$b$ (see FIG. 1). As shown in FIG. 1, the source region 12$a$ includes silicided first portions 12$a_1$ and a silicided second portion 12$a_2$, and the drain region 12$b$ includes silicided first portions 12b₁ and a silicided second portion 12b₂. A source electrode and a drain electrode are formed on the silicided second portions of the source region 12a and the drain region 12b, respectively. FIGS. 3(a) through 3(d) are cross-sectional views of the semiconductor device, taken along the section lines A-A, B-B, C-C, and D-D of FIG. 1. After that, the unreacted portions of the metal film are removed, and the hard mask layer is then removed. A silicon nitride film 14 that is to be a CESL (Contact Etch Stop Layer) and has a thickness of 60 nm is then deposited, for example. Although the first region 6b and the second region 6c are silicided in this embodiment, impurity implantation, instead of silicidation, may be performed to turn the first region 6b and the second region 6c into impurity diffusion regions of a different conductivity type from that of the channel regions.

Figure 4:
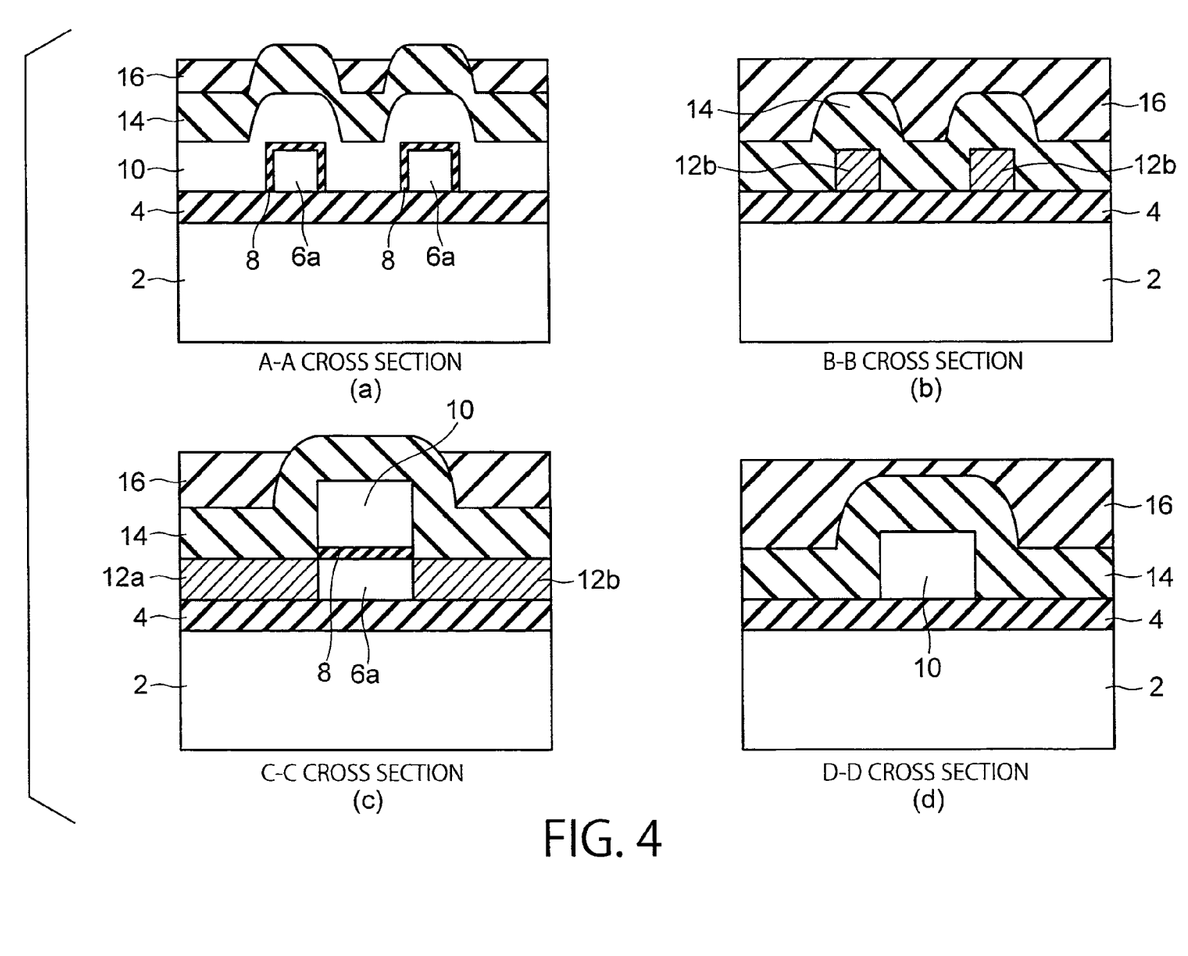
FIGS. 4(a) through 4(d) are cross-sectional views illustrating a method of manufacturing the three-dimensional multi-gate transistor according to the embodiment.

A silicon oxide film that is to be an interlayer insulating film 16 and has a thickness of approximately 600 nm is then deposited. Since the deposited film thickness is great, the upper face of the interlayer insulating film 16 is almost flat. Flattening is then performed on the silicon oxide film by CMP, until the upper faces of the portions of the silicon nitride film 14 located above the channel regions 6a are exposed. As a result, the interlayer insulating film 16 shown in FIGS. 4(a) through 4(d) is formed. FIGS. 4(a) through 4(d) are cross-sectional views of the semiconductor device, taken along the section lines A-A, B-B, C-C, and D-D, respectively, of FIG. 1. When the interlayer insulating film 16 is formed, the portions of the silicon nitride film 14 located above the channel regions 6a are the highest, and therefore, those portions of the silicon nitride film 14 serve as stoppers when CMP is performed on the silicon oxide film. That is, the silicon nitride film 14 turns into a CESL. Through the CMP, the thickness (20 nm or smaller, for example) of the portion in the interlayer insulating film 16 located immediately above the gate electrode 10 as shown in FIG. 4(d) is much smaller than the thickness of the portions in the interlayer insulating film 16 located immediately above the drain region 12b as shown in FIG. 4(b).

Figure 5:
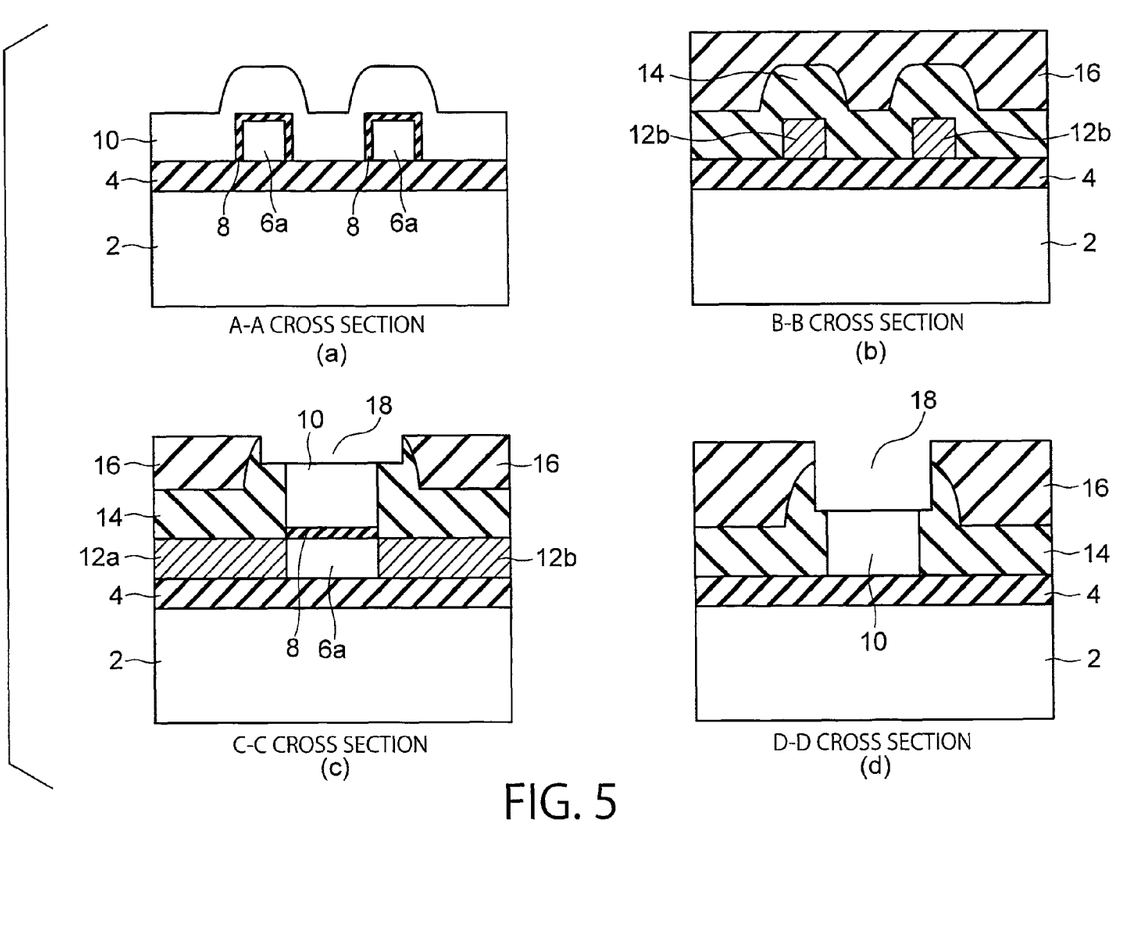
FIGS. 5(a) through 5(d) are cross-sectional views illustrating a method of manufacturing the three-dimensional multi-gate transistor according to the embodiment.
Figure 6:
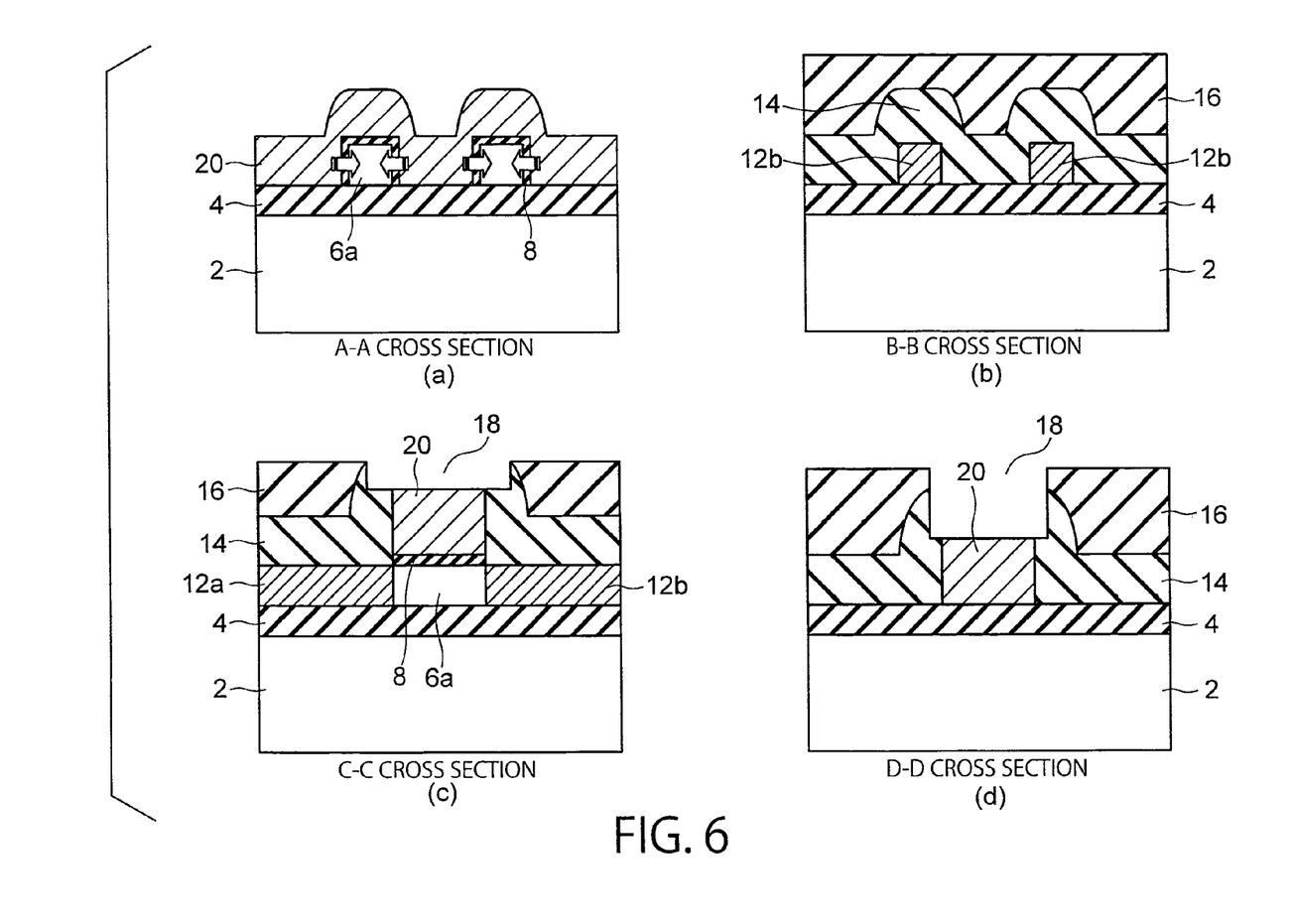
FIGS. 6(a) through 6(d) are cross-sectional views illustrating a method of manufacturing the three-dimensional multi-gate transistor according to the embodiment.
Figure 7:
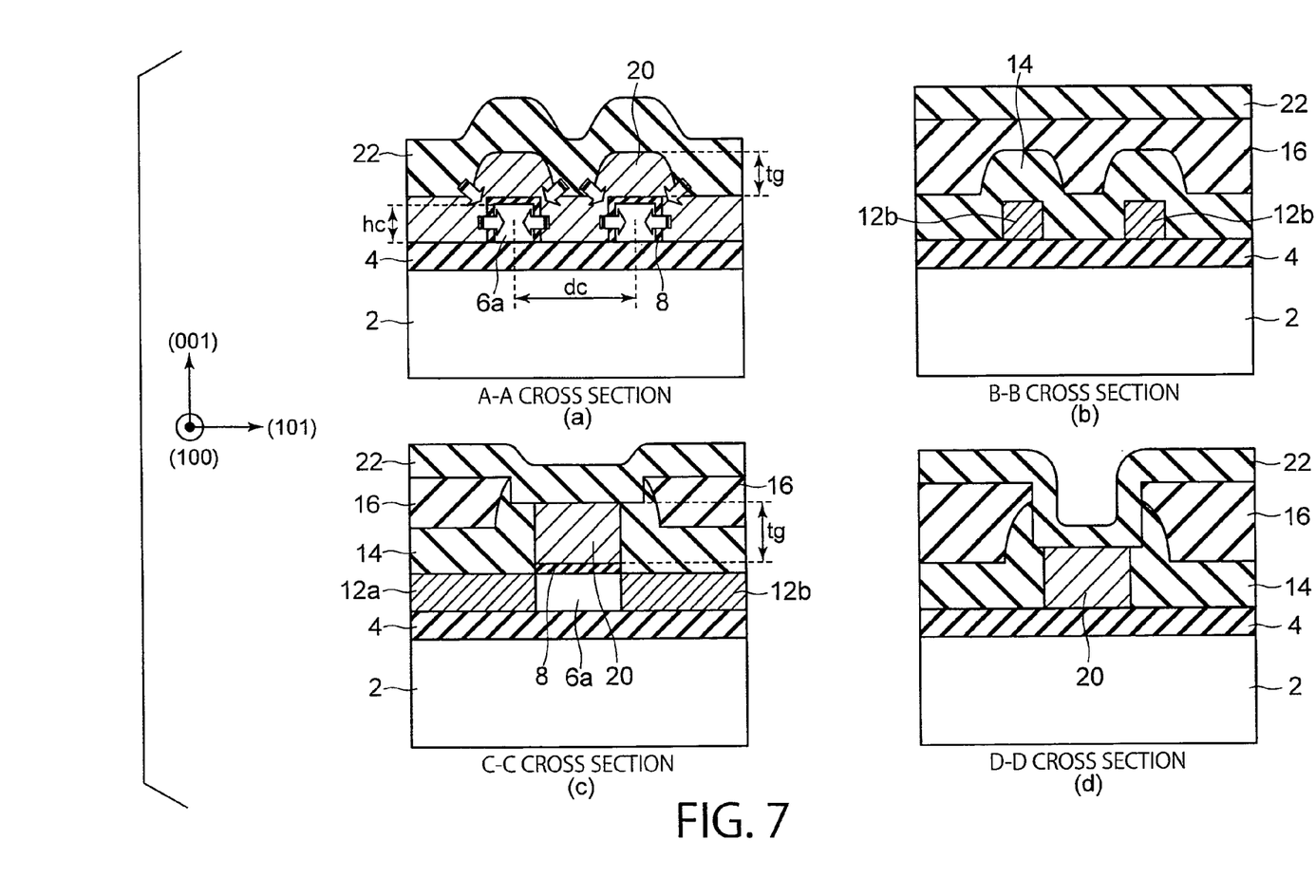
FIGS. 7(a) through 7(d) are cross-sectional views illustrating a method of manufacturing the three-dimensional multi-gate transistor according to the embodiment.

As shown in FIGS. 5(a) through 5(d), etchback is then performed on the exposed portions of the silicon nitride film 14 by using RIE (Reactive Ion Etching) with high selectivity for silicon nitride with respect to silicon oxide. FIGS. 5(a) through 5(d) are cross-sectional views of the semiconductor device, taken along the section lines A-A, B-B, C-C, and D-D, respectively, of FIG. 1. As etchback is performed on the exposed portions of the silicon nitride film 14, the upper face of the portion of the polysilicon film forming the gate electrode 10 is exposed as shown in FIGS. 5(a) and 5(c), and an opening 18 is formed in the silicon nitride film 14 on the gate electrode 10 (FIG. 5(c)). At this point, the film thickness of the portion of the interlayer insulating film 16 located immediately above the gate electrode 10 is very thin, that is, as small as 20 nm or less, for example, as described with reference to FIG. 4(d). Accordingly, the portion of the interlayer insulating film 16 is etched, and the upper face of the silicon nitride film 14 is exposed. The silicon nitride film 14 is then etched, and the opening 18 is formed in the silicon nitride film 14 on the gate electrode 10, as in the case illustrated in FIG. 5(c) (FIG. 5(d)).

However, as shown in FIGS. 5(b) and 5(c), the thick interlayer insulating film 16 exists above the source region 12a and the drain region 12b (see FIG. 1). Therefore, the source region 12a and the drain region 12b remain surrounded by the interlayer insulating film 16 and the silicon nitride film 14. In this embodiment, the portion of the interlayer insulating film 16 located immediately above the gate electrode 10 is made thinner as shown in FIG. 4(d), but may not be made thinner. In the latter case, the opening 18 shown in FIG. 5(d) is not formed, and the gate electrode 10 remains covered with the silicon nitride film 14 and the interlayer insulating film 16.

As shown in FIGS. 6(a) through 6(d), a metal film (such as a Ni film or a NiPt film) is deposited on the entire surface by using a sputtering technique, for example. A heat treatment is performed to completely silicide the gate electrode 10 that has the upper face exposed and is made of polysilicon film. In this manner, a completely silicided gate electrode 20 is formed. At this point, volume expansion occurs due to the density difference between polysilicon and silicide, and compressive stresses are applied to the channel regions 6a. In that case, the stress is applied in the channel width direction, and strain occurs in the channel width direction (see FIG. 6(a)). FIGS. 6(a) through 6(d) are cross-sectional views of the semiconductor device, taken along the section lines A-A, B-B, C-C, and D-D, respectively, of FIG. 1.

As shown in FIGS. 7(a) through 7(d), a silicon nitride film 22 of 50 to 100 nm in film thickness is deposited to cover the exposed gate electrode 20, and stresses are additionally applied to the channel regions 6a, depending on the concavities and convexities in the gate electrode 20. The stresses caused by the silicon nitride film 22 are also applied in the gate width direction ((101)-direction) of the channel regions 6a as shown in FIG. 7(a), and strain occurs in the gate width direction. That is, in this embodiment, the compressive stresses applied to the channel regions 6a through the volume expansion of the silicided gate electrode 20, and the compressive stresses applied to the channel regions 6a from the silicon nitride film 22 due to the concavities and convexities in the gate electrode 20 both act in the gate width direction ((101)-direction) of the channel regions 6a. Therefore, larger compressive stresses act on the channel regions 6a, and larger strain can occur in the channel regions 6a. Accordingly, in spite of miniaturization, the carrier mobility can be made higher, and the drive current can be increased.

FIGS. 7(a) through 7(d) are cross-sectional views of the semiconductor device, taken along the section lines A-A, B-B, C-C, and D-D, respectively, of FIG. 1.

As described so far, in the three-dimensional multi-gate transistor manufactured by the manufacturing method according to this embodiment, uniaxial stresses are applied in the gate width direction (the channel width direction) of the channel regions 6a through the volume expansion of the completely silicided gate electrode 20 and from the silicon nitride film 22 formed to cover the gate electrode 20 having concavities and convexities, so that strain can occur in the gate width direction. Accordingly, the carrier mobility can be improved, and the drive current can be increased, in spite of miniaturization. In that case, to secure sufficient concavities and convexities in the completely silicided gate electrode 20 and achieve a greater effect from the silicon nitride film 22, the height $h_c$ (see FIG. 7(a)) of the channel regions 6a is preferably great, the silicide thickness $t_g$ (see FIGS. 7(a) and 7(c)) of the gate electrode 20 is preferably small, and the distance between the adjacent channel regions 6a (the center-to-center distance $d_c$ between adjacent Fins) is preferably long. However, to restrain short channel effects, the height of the channel regions 6a (or the diameter of each of the channel regions 6a if the cross-sectional shape of each channel region 6a is circular) needs to be 20 nm or smaller, and it is difficult to make the silicide thickness $t_g$ of the gate electrode 20 smaller than 30 nm, with the reliability of the gate structure being taken into consideration. Also, to maintain the drive current, the distance $d_c$ between the adjacent channel regions 6a needs to be made shorter than 100 nm. Where the ratio of the height $h_c$ of the channel regions 6a is 2, the ratio of the silicide thickness $t_g$ of the gate electrode 20 is preferably 3 to 10 (the ratio of the thickness of the polysilicon film 10 prior to the silicidation is 1.5 to 5), and the ratio of the distance $d_c$ between the adjacent channel regions 6a is preferably 3 to 10 or lower.

Therefore, the semiconductor device of this embodiment includes semiconductor layers formed at a distance from one another on the insulating film 4, and each of the semiconductor layers includes the source region 12a and the drain region 12b formed at a distance from each other in the extending direction of the semiconductor layers, and the channel regions 6a formed between the source region 12a and the drain region 12b. As shown in FIG. 1, the source region 12a of each of the semiconductor layers includes the first portions $12a_1$ connected to the channel regions 6a, and the second portion $12a_2$ that is connected to the first portions $12a_1$, and is as tall as the first portions $12a_1$ but is wider than the first portions $12a_1$. The drain region 12b includes the first portions $12b_1$ connected to the channel regions 6a, and the second portion $12b_2$ that is connected to the first portions $12b_1$, and is as tall as the first portions $12b_1$ but is wider than the first portions $12b_1$.

The respective first portions $12a_1$ and $12b_1$ of the source region 12a and the drain region 12b are formed in the same layer as the second portions $12a_2$ and $12b_2$, and are connected together to the second portions $12a_2$ and $12b_2$. Those second portions $12a_2$ and $12b_2$ apply currents to the first portions $12a_1$ and $12b_1$, and have the functions of pads that receive currents from the first portions $12a_1$ and $12b_1$. Therefore, the second portions $12a_2$ and $12b_2$ may not be formed in the same layer as the first portions $12a_1$ and $12b_1$, but may be formed as contacts that are located in an interlayer insulating film covering the first portions $12a_1$ and $12b_1$, and are electrically connected to the first portions $12a_1$ and $12b_1$.

As shown in FIG. 7(a), the gate insulating film 8 is formed on both side faces and the upper face of each of the channel regions 6a of each of the semiconductor layers. Also, the silicide gate electrode 20 is formed to cover the gate insulating film 8 of each of the semiconductor layers. The insulating films 14 and 16 that cover the side faces of the gate electrode 20 and have openings on the gate electrode 20 at least immediately above the channel regions 6a are also provided (FIGS. 7(c) and 7(d)). Further, the stress applying film 22 that covers the upper face of the gate electrode 20, and applies stresses to the channel regions 6a of each of the semiconductor layers is provided. The stresses are applied in a direction that is perpendicular to the extending direction of each of the semiconductor layers and is parallel to the upper face of the insulating film 4.

As described above, in the semiconductor device of this embodiment, uniaxial stresses are applied in the gate width direction (the channel width direction) of the channel regions 6a through the volume expansion of the completely silicided gate electrode 20 and the silicon nitride film 22 formed to cover the gate electrode 20 having concavities and convexities, so that strain can occur in the gate width direction. Accordingly, the carrier mobility can be improved, and the drive current can be increased, in spite of miniaturization.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming a plurality of semiconductor layers that are located at a distance from one another on a first insulating film by performing patterning on a silicon film placed on the first insulating film, each of the semiconductor layers including a first region, a second region that is formed at a distance from the first region in an extending direction of each of the semiconductor layers, and a third region provided between the first region and the second region;
    forming a gate insulating film that covers both side faces and an upper face of the third region of each of the semiconductor layers;
    forming a gate electrode that is a polysilicon film to cover the gate insulating film of each of the semiconductor layers;
    forming a source region and a drain region in the first and second regions of each of the semiconductor layers;
    forming a second insulating film on an entire surface;
    exposing an upper face of the gate electrode by performing selective etching on a portion of the second insulating film, the portion being located above the gate electrode;
    siliciding the gate electrode; and
    forming a stress applying film that applies a stress to the third region of each of the semiconductor layers, the stress applying film being formed to cover the silicided gate electrode, the stress being applied in a direction that is perpendicular to the extending direction of each of the semiconductor layers and is parallel to an upper face of the first insulating film.

2. The method according to claim 1, wherein
    the second insulating film includes a third insulating film and a fourth insulating film,
    the forming of the second insulating film includes:
        forming the third insulating film on the entire surface, the third insulating film covering the upper face and side faces of the gate electrode; and
        forming the fourth insulating film that covers the third insulating film and is made of a different material from the third insulating film,
    the exposing of the upper face of the gate electrode by performing the selective etching on the portion of the second insulating film located above the gate electrode includes:
        flattening the fourth insulating film until an upper face of a portion of the third insulating film is exposed, the portion being located above the third region; and
        exposing the upper face of the gate electrode by performing etching on the exposed third insulating film and the fourth insulating film by using an etching technique with high etching selectivity for the third insulating film with respect to the fourth insulating film.

3. The method according to claim 1, wherein the stress applying film is a silicon nitride film.

4. The method according to claim 1, wherein the forming of the gate electrode that is the polysilicon film is performed so that the polysilicon film covers the first insulating film located between the third regions of adjacent ones of the semiconductor layers.

5. The method according to claim 1, wherein the first and second regions are silicided and are turned into a source region and a drain region.

6. The method according to claim 1, wherein ratios among a height of the third region from the upper face of the first insulating film, a thickness of the silicided gate electrode, and a center-to-center distance between adjacent ones of the semiconductor layers fall within the range of 2:3:3 to 2:10:10.

7. The method according to claim 6, wherein
the height of the third region from the upper face of the first insulating film is 20 nm or smaller,
the thickness of the silicided gate electrode is 30 nm or greater, and
the center-to-center distance between adjacent ones of the semiconductor layers is shorter than 100 nm.

* * * * *